(12) United States Patent
Lu et al.

(10) Patent No.: US 12,396,088 B2
(45) Date of Patent: Aug. 19, 2025

(54) CIRCUIT BOARD ASSEMBLY AND METHOD FOR MANUFACTURING THE SAME

(71) Applicants: QING DING PRECISION ELECTRONICS (HUAIAN) CO., LTD, Huai an (CN); Avary Holding (Shenzhen) Co., Limited., Shenzhen (CN); GARUDA TECHNOLOGY CO., LTD., New Taipei (TW)

(72) Inventors: Xin Lu, Huai an (CN); Wei-Xiang Li, Shenzhen (CN)

(73) Assignees: QING DING PRECISION ELECTRONICS (HUAIAN) CO., LTD, Huai an (CN); Avary Holding (Shenzhen) Co., Limited., Shenzhen (CN); GARUDA TECHNOLOGY CO., LTD., New Taipei (TW)

( * ) Notice: Subject to any disclaimer, the term of this patent is extended or adjusted under 35 U.S.C. 154(b) by 288 days.

(21) Appl. No.: 18/097,095

(22) Filed: Jan. 13, 2023

(65) Prior Publication Data
US 2023/0156906 A1    May 18, 2023

Related U.S. Application Data

(63) Continuation-in-part of application No. PCT/CN2021/100742, filed on Jun. 17, 2021.

(51) Int. Cl.
H05K 1/02 (2006.01)
H05K 1/18 (2006.01)
H05K 3/32 (2006.01)

(52) U.S. Cl.
CPC ............ *H05K 1/021* (2013.01); *H05K 1/183* (2013.01); *H05K 3/32* (2013.01); *H05K 1/0203* (2013.01); *H05K 2201/10121* (2013.01)

(58) Field of Classification Search
CPC ......... H05K 1/021; H05K 2201/09745; H05K 2201/2009; H05K 1/0298;
(Continued)

(56) References Cited

U.S. PATENT DOCUMENTS

| | | | |
|---|---|---|---|
| 4,835,598 A * | 5/1989 | Higuchi | H05K 1/021 |
| | | | 257/E23.101 |
| 7,116,557 B1 * | 10/2006 | Raby | H05K 1/183 |
| | | | 29/841 |

(Continued)

FOREIGN PATENT DOCUMENTS

| | | |
|---|---|---|
| CN | 107896423 A | 4/2018 |
| CN | 110445957 A | 11/2019 |
| TW | 201820559 A | 6/2018 |

*Primary Examiner* — Steven T Sawyer
(74) *Attorney, Agent, or Firm* — ScienBiziP, P.C.

(57) ABSTRACT

A circuit board assembly includes an inner circuit substrate, a first outer circuit substrate, a second outer circuit substrate, a heat conducting block, an electronic component, and a reinforcing plate. The first outer circuit substrate and second outer circuit substrate are disposed on surfaces of the inner circuit substrate. The heat conducting block penetrates through the inner circuit substrate and connects to the first outer circuit substrate and the second outer circuit substrate. The heat conducting block made of aluminum nitride. An electronic component at least partially accommodated in the heat conducting block. The reinforcing plate is disposed on a surface of the second outer circuit substrate corresponding to the electronic component and faces away from the electronic component. The present disclosure further provides a method for manufacturing the circuit board assembly.

10 Claims, 10 Drawing Sheets

(58) Field of Classification Search
CPC .. H05K 1/182–185; H05K 1/0182–185; H01L 23/5389; H01K 1/0203
See application file for complete search history.

(56) References Cited

U.S. PATENT DOCUMENTS

| | | | |
|---|---|---|---|
| 11,122,674 B1* | 9/2021 | Yu | H05K 1/0204 |
| 11,160,160 B1* | 10/2021 | Berkel | H01L 23/13 |
| 2005/0130349 A1* | 6/2005 | Sunohara | H01L 21/563 |
| | | | 257/E21.503 |
| 2007/0164291 A1* | 7/2007 | Kim | H05K 1/021 |
| | | | 257/79 |
| 2013/0228362 A1* | 9/2013 | Berkel | H01L 23/3677 |
| | | | 165/185 |
| 2021/0144841 A1* | 5/2021 | Wang | H05K 3/0047 |
| 2022/0301975 A1* | 9/2022 | Ham | H01L 21/486 |
| 2022/0361324 A1* | 11/2022 | Ji | H01L 21/4857 |

* cited by examiner

CIRCUIT BOARD ASSEMBLY AND METHOD FOR MANUFACTURING THE SAME

FIELD

The subject matter herein generally relates to circuit boards, and more particularly, to a circuit board assembly and a method for manufacturing the same.

BACKGROUND

A circuit board is used as a support and a carrier for an electronic component. The electronic component is embedded in the circuit board to reduce the thickness of the electronic product, but it causes heat dissipation problems. Therefore, there is a room for improvement in the art.

BRIEF DESCRIPTION OF THE DRAWINGS

Implementations of the present technology will now be described, by way of example only, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

Some embodiments of the present disclosure will be described in detail with reference to the drawings. If no conflict, the following embodiments and features in the embodiments can be combined with each other.

A method for manufacturing a circuit board assembly 100 is provided according to an embodiment of the present disclosure.

Figure 1:
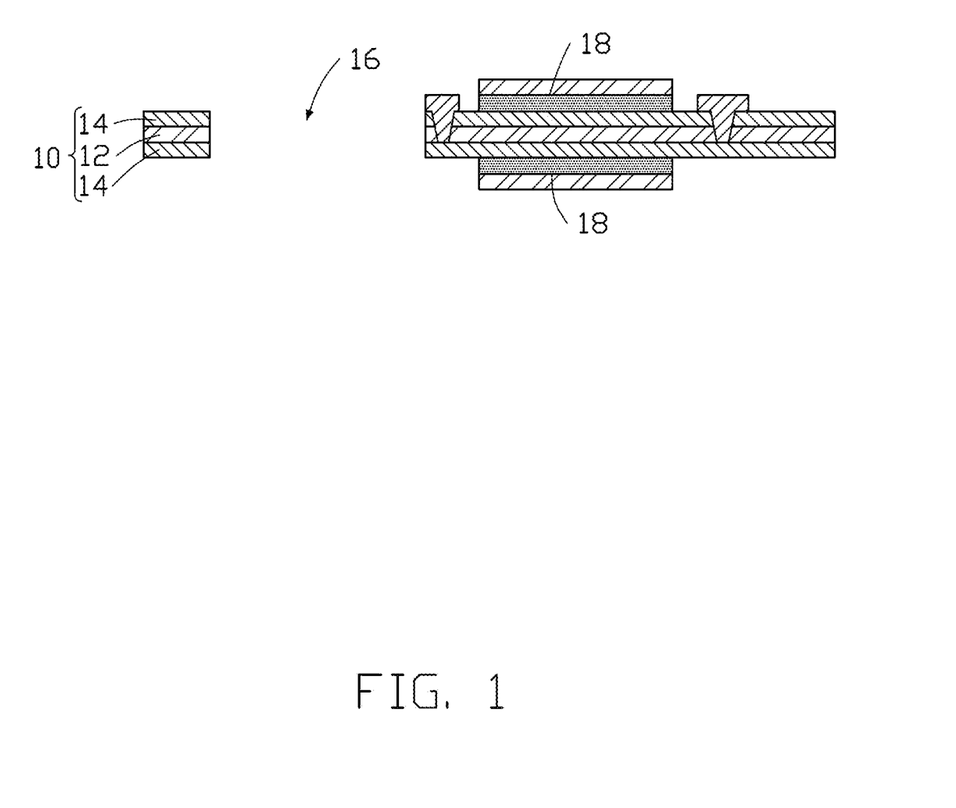
FIG. 1 is a cross-sectional view of an embodiment of an inner circuit substrate according to the present disclosure.

In step 1, referring to FIG. 1, an inner circuit substrate 10 including a through hole 16 is provided.

The inner circuit substrate 10 includes an inner dielectric layer 12 and two inner circuit layers 14. The two inner circuit layers 14 are disposed on opposite surfaces of the inner dielectric layer 12. In other embodiments, the number of the inner circuit layers 14 can be more, and the multilayer inner circuit layers 14 are electrically connected to each other.

The two inner circuit layers 14 can be made of flexible materials such as polyimide, liquid crystal polymer, and modified polyimide. The two inner circuit layers 14 also can be made of hard materials such as polypropylene, and polytetrafluoroethylene. In the embodiment, the inner dielectric layer 12 is made of polypropylene.

The through hole 16 penetrates through the inner dielectric layer 12 and the two inner circuit layers 14 along a direction in which the inner dielectric layer 12 and the inner circuit layers 14 are stacked.

In some embodiments, the inner circuit substrate 10 can further include an insulating layer 18 disposed on two opposite surfaces of a portion of the inner circuit substrate 10.

Figure 2:
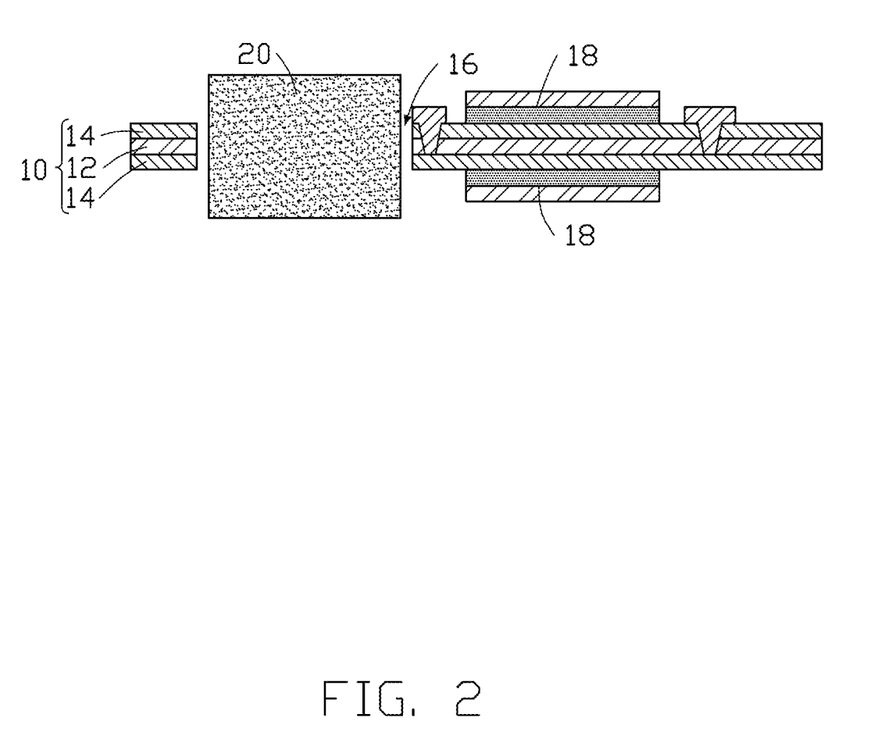
FIG. 2 is a cross-sectional view showing a heat conducting block placed in a through hole of FIG. 1.

In step 2, referring to FIG. 2, a heat conducting block 20 is placed in the through hole 16.

The heat conducting block 20 is made of aluminum nitride. A thermal conductivity of the aluminum nitride is 320 W/(m·K), and an elasticity modulus of aluminum nitride is 320 Gpa. A thermal conductivity of stainless steel is 12.3 W/(m·K), and an elasticity modulus of stainless steel is 190 Gpa. Compared with stainless steel, the aluminum nitride has the characteristics of high thermal conductivity and high rigidity.

In some embodiments, the heat conducting block 20 is spaced apart from the sidewall forming the through hole 16. That is, there is a gap between the heat conducting block 20 and the inner circuit substrate 10.

Figure 3:
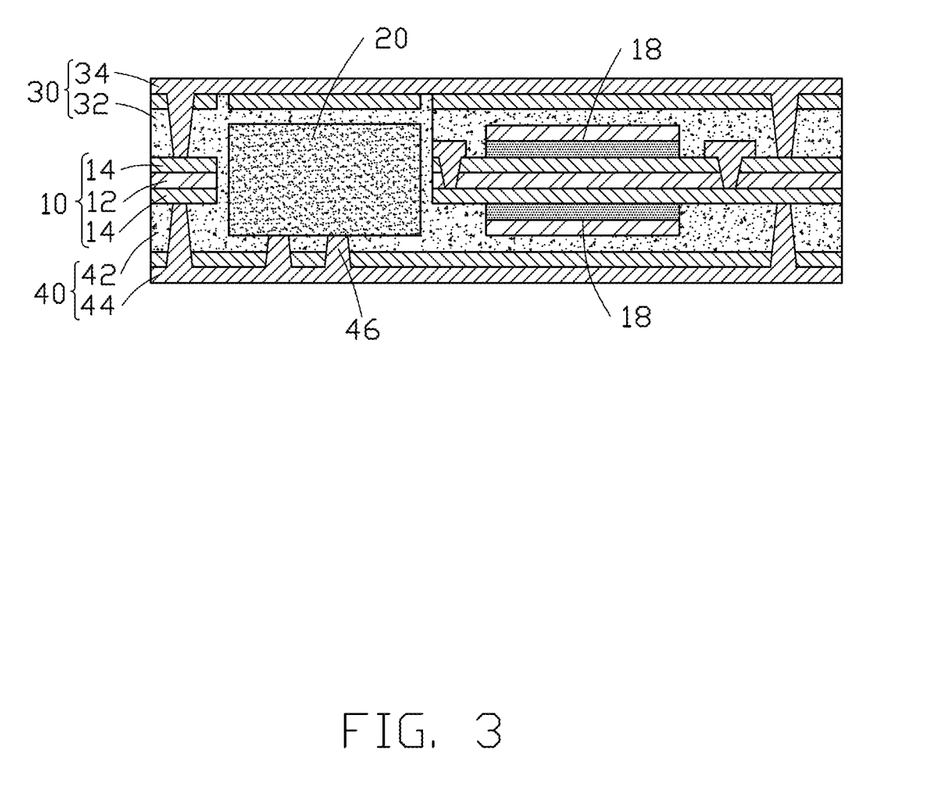
FIG. 3 is a cross-sectional view showing a first outer circuit substrate and a second outer circuit substrate formed on opposite surfaces of the inner circuit substrate of FIG. 1.

In step 3, referring to FIG. 3, a first outer circuit substrate 30 and a second outer circuit substrate 40 are formed on opposite surfaces of the inner circuit substrate 10, and the first outer circuit substrate 30 and the second outer circuit substrate 40 cover the heat conducting block 20.

The first outer circuit substrate 30 includes a first outer dielectric layer 32 and a first outer circuit layer 34. The second outer circuit substrate 40 includes a second outer dielectric layer 42 and a second outer circuit layer 44. The number of each of the first outer dielectric layer 32, the first outer circuit layer 34, the second outer dielectric layer 42 and the second outer circuit layer 44 may be one or more. Both the first outer circuit substrate 30 and the second outer circuit substrate 40 are electrically connected to the inner circuit substrate 10. The first outer dielectric layer 32 and the second outer dielectric layer 42 are connected to the heat conducting block 20.

In some embodiments, during forming the first outer circuit substrate 30 and the second outer circuit substrate 40, the first outer dielectric layer 32 and the second outer dielectric layer 42 further fill the gap between the heat conducting block 20 and the inner circuit substrate 10. The first outer dielectric layer 32 or the second outer dielectric layer 42 filled in the gap can fix and buffer the heat conducting block 20.

In some embodiments, during forming the second outer circuit substrate 40, the method further includes forming a connecting block 46 connecting the heat conducting block 20 and the second outer circuit layer 44. The connecting block 46 penetrates through the second outer dielectric layer 42, so as to connect the second outer circuit layer 44 disposed on a surface of the second outer circuit substrate 40 away from the heat conducting block 20 to the heat conducting block 20.

In some embodiments, the first outer circuit substrate 30 and the second outer circuit substrate 40 further cover the insulating layer 18.

In some embodiments, a solder mask 50 is formed on surfaces of the first outer circuit substrate 30 and the second outer circuit substrate 40 facing away from the inner circuit substrate 10 to protect the first outer circuit layer 34 and the second outer circuit layer 44.

Figure 4:
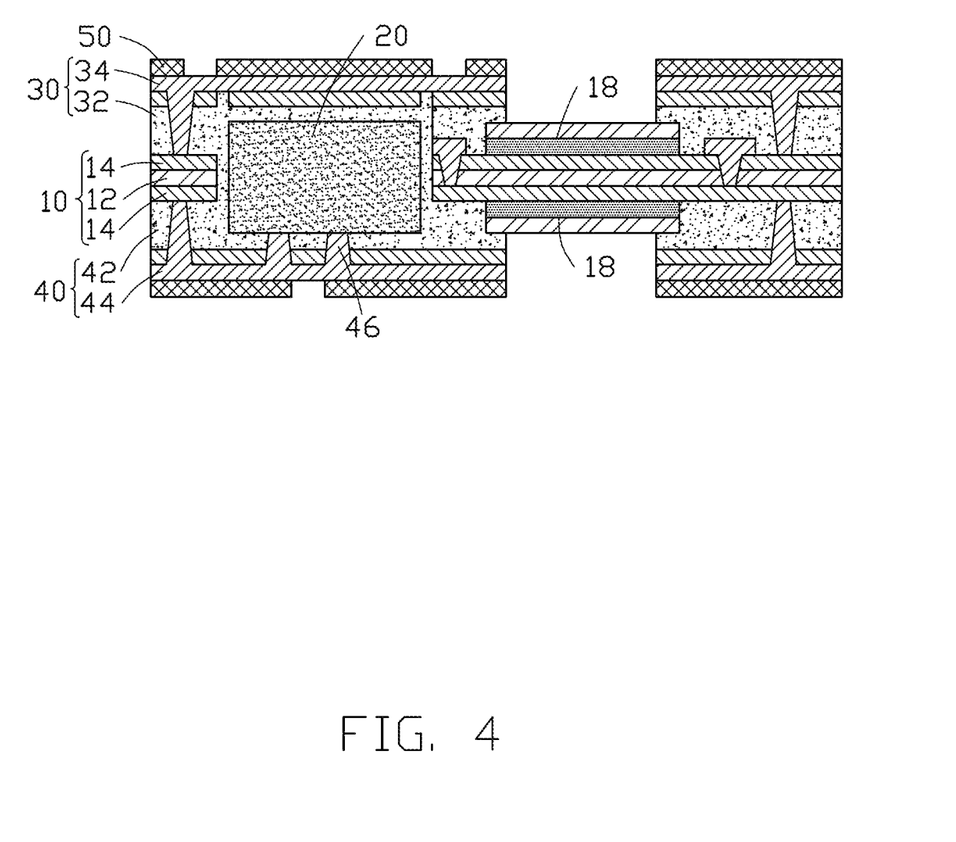
FIG. 4 is a cross-sectional view showing the first outer circuit substrate and the second outer circuit substrate corresponding to an insulating layer of FIG. 3 removed to expose the insulating layer.

In step 4, referring to FIG. 4, the first outer circuit substrate 30 and the second outer circuit substrate 40 corresponding to the insulating layer 18 are removed to expose the insulating layer 18, thereby forming a flexible region.

In some implementations, the step 4 can be omitted.

Figure 5:
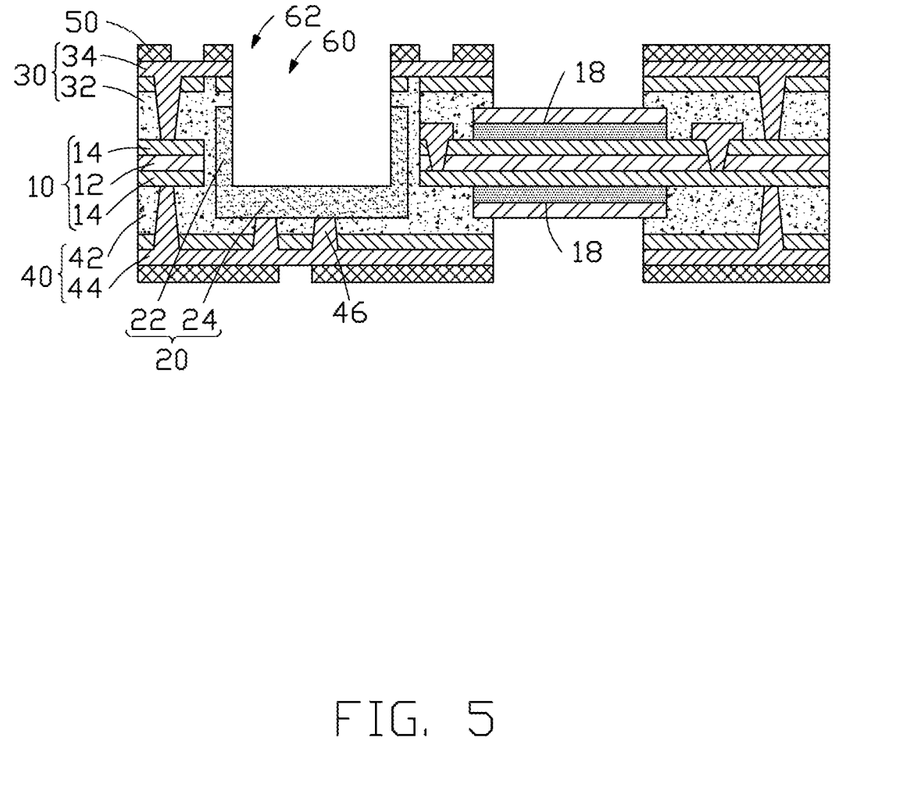
FIG. 5 is a cross-sectional view showing an accommodating groove passing through the first outer circuit substrate of FIG. 4 and recessed toward the heat conducting block.

In step 5, referring to FIG. 5, an accommodating groove 60 is formed, which penetrates through the first outer circuit substrate 30 and is recessed toward the heat conducting block 20.

The accommodating groove 60 is formed along the direction in which the first outer circuit substrate 30, the inner circuit substrate 10, and the second outer circuit substrate 40 are stacked. During forming the accommodating groove 60, the first outer circuit substrate 30 is penetrated, and then a portion of the heat conducting block 20 is removed to form the accommodating groove 60. That is, the accommodating groove 60 penetrates the first outer circuit substrate 30 but does not penetrate the heat conducting block 20, forming the heat conducting block 20 with a side wall 22 and a bottom wall 24.

Figure 6:
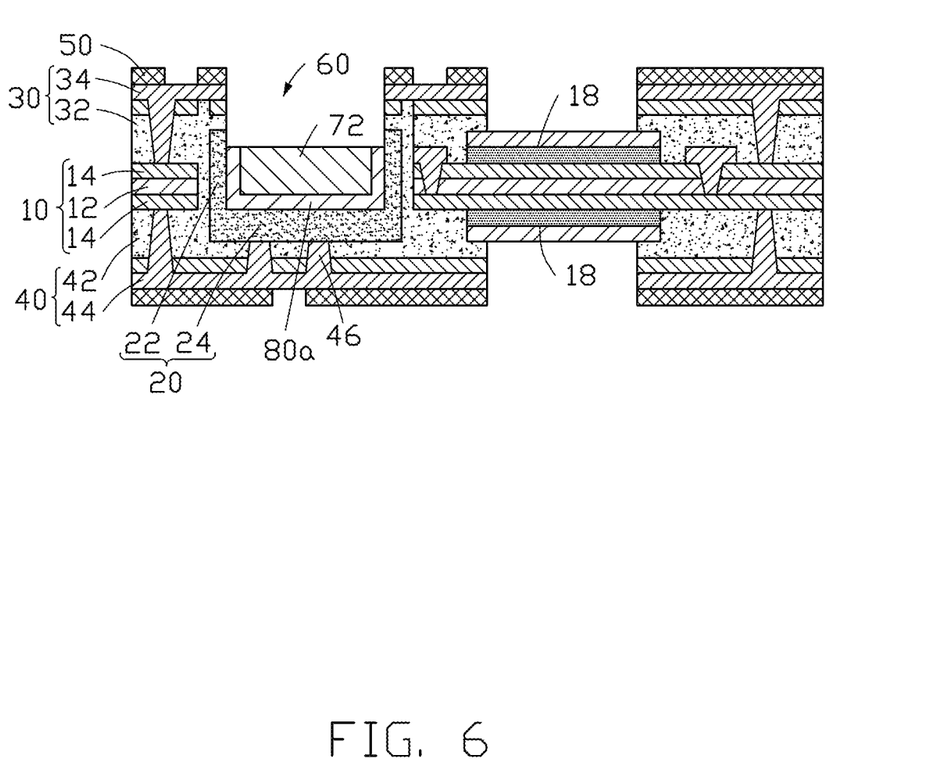
FIG. 6 is a cross-sectional view showing a thermally conductive filler and a first sub-component accommodated in the accommodating groove of FIG. 5.
Figure 7:
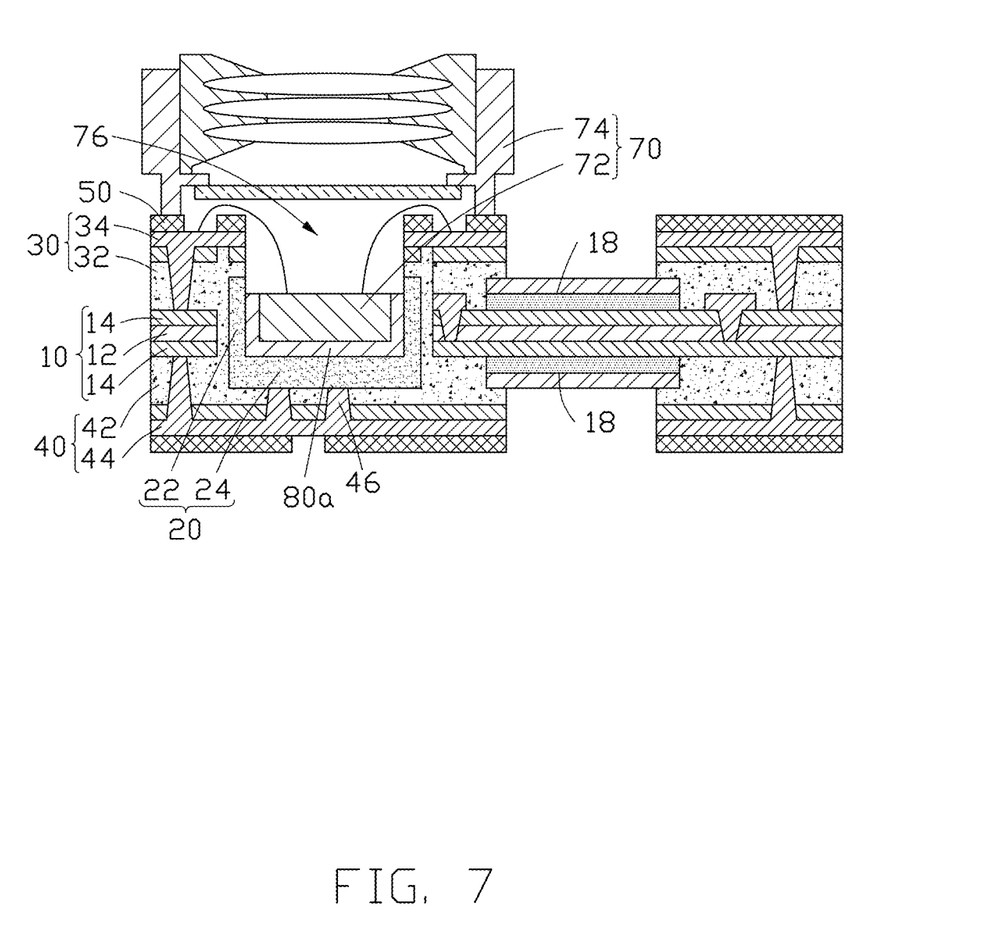
FIG. 7 is a cross-sectional view showing a second sub-component connected to a surface of the first outer circuit substrate of FIG. 6.

In step 6, referring to FIGS. 6 and 7, an electronic component 70 is accommodated in the accommodating groove 60, and the electronic component 70 is at least partially accommodated in the accommodating groove 60.

The electronic component 70 is electrically connected to the first outer circuit substrate 30.

The electronic component 70 can be an integral structure, or can include at least one first sub-component 72 and at least one second sub-component 74.

In the embodiment, taking the electronic component 70 including a first sub-component 72 and a second sub-component 74 as an example, the electronic component 70 is a lens module, the first sub-component 72 is a chip, and the second sub-component 74 is a lens. The chip and the lens cooperatively form a hollow cavity 76. In other embodiments, the electronic component 70 is not limited to a lens module.

Accommodating the electronic component 70 in the accommodating groove 60 may be carried out as follows.

In step 601: referring to FIG. 6, a heat conducting filler 80a is filled in the accommodating groove 60.

The heat conducting filler 80a can be thermally conductive adhesive, which has both bonding effect and thermally conductive effect.

The heat conducting filler 80a is filled in the heat conducting block 20, and the heat conducting filler 80a is connected to the side wall 22 and the bottom wall 24.

In step 602: referring to FIG. 6, the first sub-component 72 is placed in the heat conducting filler 80a, the heat conducting filler 80a covers the periphery of the first sub-component 72, so that the first sub-component 72 is spaced apart from the heat conducting block 20. A portion of the first sub-component 72 used for electrical connection is exposed from the heat conducting filler 80a.

The heat conducting filler 80a connects the first sub-component 72 and the heat conducting block 20, so that the heat generated by the first sub-component 72 can be quickly transferred to the heat conducting block 20. The heat conducting filler 80a further plays a buffering role, preventing the first sub-component 72 from being damaged due to rigid contact with the heat conducting block 20.

In some embodiments, a distance between the first sub-component 72 and the heat conducting block 20 can be from 0.1 mm to 0.7 mm. In an embodiment, the distance between the first sub-component 72 and the heat conducting block 20 is 0.3 mm.

In step 603: referring to FIG. 7, a second sub-component 74 is connected to a surface of the first outer circuit substrate 30, and the second sub-component 74 is electrically connected to the first sub-component 72.

Figure 8:
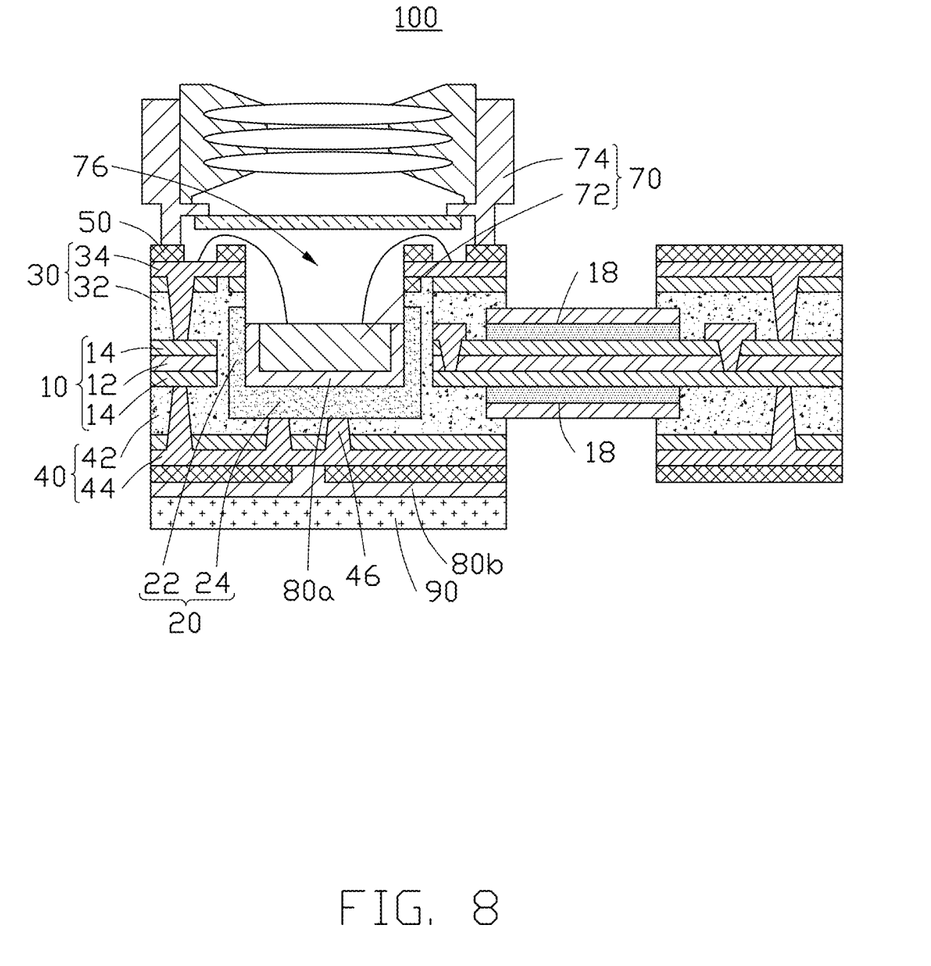
FIG. 8 is a cross-sectional view showing a reinforcing plate formed on a surface of the second outer circuit substrate corresponding to the first sub-component of FIG. 4 to form a circuit board assembly.

In step 7, referring to FIG. 8, a reinforcing plate 90 is formed on a surface of the second outer circuit substrate 40 corresponding to the electronic component 70 and facing away from the electronic component 70, so as to form the circuit board assembly 100.

The reinforcing plate 90 can be made of stainless steel, red copper, aluminum nitride, graphene, and other materials with high thermal conductivity and high hardness.

The reinforcing plate 90 may be connected to the second outer circuit substrate 40 through the heat conducting filler 80b. The heat conducting filler 80b can be a thermally conductive adhesive, which functions as both bonding and thermal conductivity.

The step of forming the reinforcing plate 90 is any step after forming the second outer circuit substrate 40. That is, the step of forming the reinforcing plate 90 may be before the step of forming the accommodating groove 60 or forming the electronic component 70.

Figure 9:
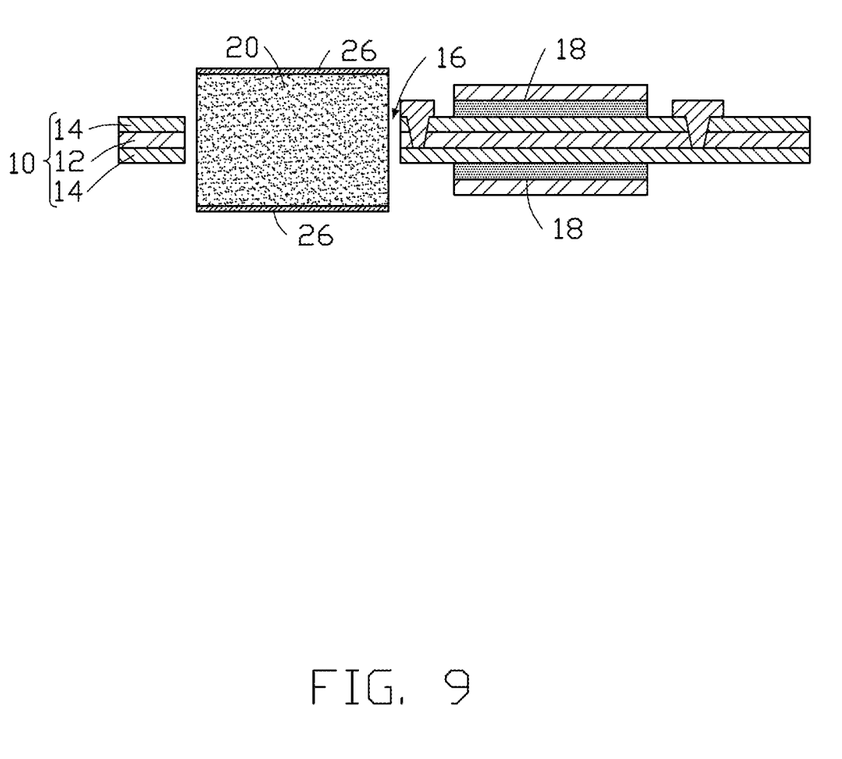
FIG. 9 is a cross-sectional view showing of another embodiment of a heat conducting block with a metal layer on its surface placed in a through hole of FIG. 1.
Figure 10:
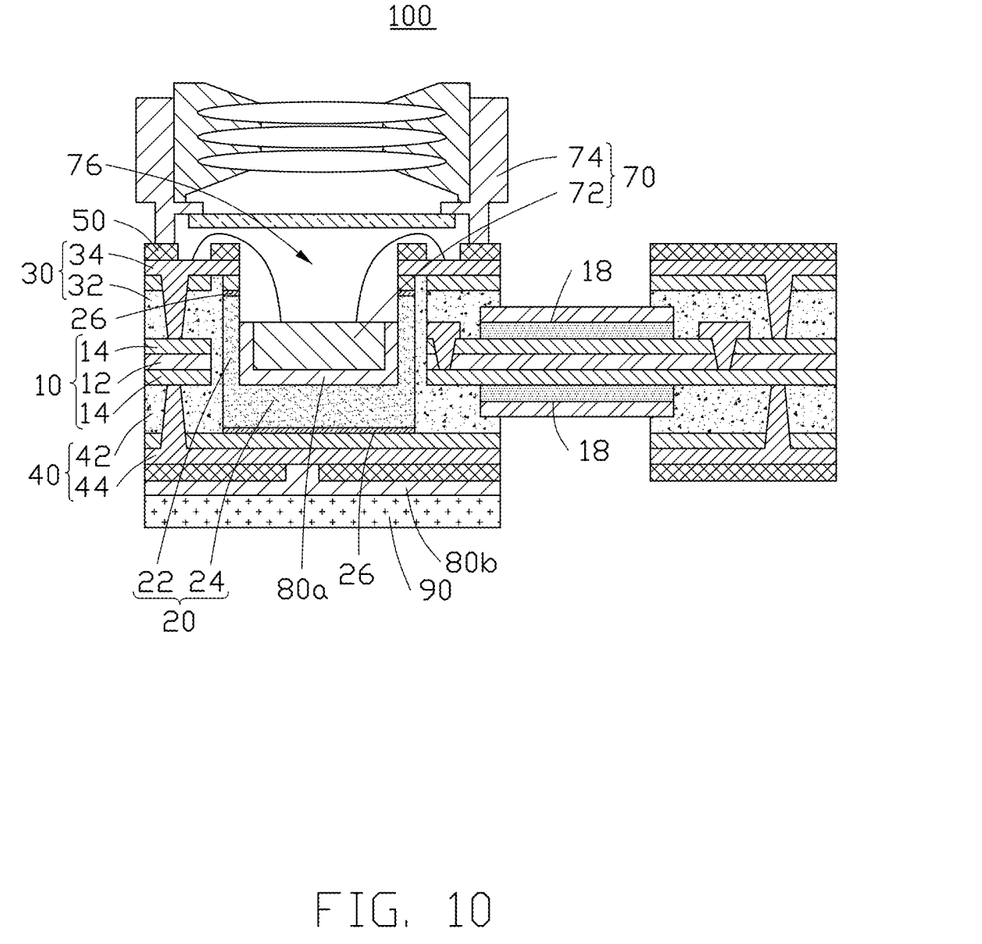
FIG. 10 is a cross-sectional view showing another embodiment of a circuit board assembly according to the present disclosure.

In other embodiments, in block 2, referring to FIG. 9, a metal layer 26 is disposed on a surface of the heat conducting block 20. The metal layer 26 can be made of copper, silver, or the like. The metal layer 26 is substantially parallel to an extending direction of the inner circuit substrate 10. In step 3, during forming the first outer circuit substrate 30 and the second outer circuit substrate 40, the first outer circuit layer 34 and the second outer circuit layer 44 are contact with the metal layer 26. Referring to FIG. 10, the heat generated by the electronic component 70 penetrates through the heat conducting block 20 of the circuit board assembly 100, and then quickly transfers to the first outer circuit layer 34 and the second outer circuit layer 44 through the metal layer 26, thereby increasing the rate of heat transfer. In the embodiment, the connecting block 46 is omitted.

Referring to FIG. 8 again, a circuit board assembly 100 is provided according to an embodiment of the present disclosure. The circuit board assembly 100 includes an inner circuit substrate 10, a first outer circuit substrate 30, a second outer circuit substrate 40, an electronic component 70, a heat conducting block 20, and a reinforcing plate 90.

The inner circuit substrate 10, the first outer circuit substrate 30, and the second outer circuit substrate 40 may be flexible boards, rigid boards or rigid-flex boards.

The inner circuit substrate 10 includes an inner dielectric layer 12 and two inner circuit layers 14 stacked with each other. The first outer circuit substrate 30 includes a first outer dielectric layer 32 and a first outer circuit layer 34 stacked with each other. The second outer circuit substrate 40 includes a second outer dielectric layer 42 and a second outer circuit layer 44 stacked with each other.

The first outer circuit substrate 30 and the second outer circuit substrate 40 are respectively disposed on opposite surfaces of the inner circuit substrate 10. The inner circuit substrate 10, the first outer circuit substrate 30, and the second outer circuit substrate 40 may be single-layer circuit substrates or multi-layer circuit substrates, respectively. The inner circuit substrate 10, the first outer circuit substrate 30, and the second outer circuit substrate 40 are electrically connected to each other.

The heat conducting block 20 penetrates through the inner circuit substrate 10. The first outer circuit substrate 30 and the second outer circuit substrate 40 cover the heat conducting block 20. The heat conducting block 20 is connected to the inner circuit substrate 10 through the first outer dielectric layer 32 or the second outer dielectric layer 42, which can prevent rigid contact between the heat conducting block 20 and the two inner circuit layers 14.

An accommodating groove 60 with an opening 62 towards the first outer circuit substrate 30 is defined on the heat conducting block 20. The heat conduction block includes a side wall 22 and a bottom wall 24, and the side wall 22 surrounds the bottom wall 24. At least portion of the electronic component 70 is accommodated in the accommodation groove 60 formed by the side wall 22 and the bottom wall 24.

In some embodiments, the electronic component 70 includes a first sub-component 72 and a second sub-component 74. The first sub-component 72 is accommodated in the accommodating groove 60, and the second sub-component 74 is disposed on a surface of the first outer circuit substrate 30 and is electrically connected to the first sub-component 72. In the embodiment, the first sub-component 72 is a chip, and the second sub-component 74 is a lens. The chip and the lens cooperatively form a hollow cavity 76.

In some embodiments, a heat conducting filler 80a is further filled between the first sub-component 72 and the heat conducting block 20. Multiple surfaces of the first sub-component 72 are contact with the heat conducting filler 80a, and the heat conducting filler 80a is contact with the heat conducting block 20 with a large contact area. The heat conducting filler 80a can quickly transfer the heat generated by the first sub-component 72 to the heat conducting block 20. In addition, due to the high rigidity of the heat conducting block 20, the heat conducting filler 80a can prevent the first sub-component 72 from being damaged due to rigid contact with the heat conducting filler 80a. The rigidity of the heat conducting block 20 is sufficient to support the first sub-component 72 and prevent the first sub-component 72 from being deformed and damaged.

In some embodiments, the circuit board assembly 100 further includes a solder mask 50 disposed on surfaces of the first outer circuit substrate 30 and the second outer circuit substrate 40 away from the inner circuit substrate 10.

The reinforcing plate 90 is disposed on a surface of the second outer circuit substrate 40 corresponding to the electronic component 70 and facing away from the electronic component 70. The reinforcing plate 90 can be connected to the second outer circuit substrate 40 through a heat conducting filler 80b.

In some embodiments, the second outer circuit substrate 40 is also connected to the heat conducting block 20 through a connecting block 46. The second outer circuit substrate 40 includes a second outer dielectric layer 42 and a second outer circuit layer 44 stacked with each other. The connecting block 46 penetrates through the second outer dielectric layer 42 and connects the second outer circuit layer 44 and the heat conducting block 20.

Further, the connecting block 46 is connected to the second outer circuit layer 44 disposed on the second outer circuit substrate 40 away from the heat conducting block 20, so as to quickly transfer the heat generated by the electronic component 70 to the outside of the circuit board assembly 100.

Referring to FIG. 10 again, in some embodiments, a surface of the heat conducting block 20 facing the first outer circuit substrate 30 and a surface facing the second outer circuit substrate 40 are both provided with a metal layer 26. The metal layer 26 is directly connected to the first outer circuit layer 34 and the second outer circuit layer 44 to conduct heat quickly.

The circuit board assembly 100 provided by the present disclosure, a portion of the electronic component 70 is embedded in the first outer circuit substrate 30 and the inner circuit substrate 10, which can effectively reduce the volume of the circuit board assembly 100. By accommodating the electronic component 70 in the heat conducting block 20 which made of aluminum nitride, due to the high heat conduction efficiency and high rigidity of aluminum nitride, the electronic component 70 and the heat conducting block 20 have multiple contact surfaces (including the side wall 22 and the bottom wall 24), which effectively improves the heat dissipation efficiency of the circuit board assembly 100. In addition, the cooperation of the aluminum nitride heat conducting block 20 and the reinforcing plate 90 can reinforce the circuit board assembly 100.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A circuit board assembly, comprising:
    an inner circuit substrate;
    a first outer circuit substrate disposed on a surface of the inner circuit substrate;
    a second outer circuit substrate disposed on another surface of the inner circuit substrate away from the first outer circuit substrate;
    a heat conducting block penetrating through the inner circuit substrate and connecting to each of the first outer circuit substrate and the second outer circuit substrate, and an accommodating groove with an opening towards the first outer circuit substrate defined on the heat conducting block, the heat conducting block made of aluminum nitride;

a lens module comprising a chip and a lens, the chip accommodated in the accommodating groove and electrically connected to the first outer circuit substrate, the lens disposed on a surface of the first outer circuit substrate and electrically connected to the chip, and the chip and the lens cooperatively forming a hollow cavity; and a reinforcing plate disposed on a surface of the second outer circuit substrate corresponding to the lens module and facing away from the lens module.

2. The circuit board assembly of claim 1, wherein the circuit board assembly further comprises a heat conducting filler, and the heat conducting filler is disposed between the chip and the heat conducting block.

3. The circuit board assembly of claim 1, wherein the first outer circuit substrate comprises a first outer circuit layer, the second outer circuit substrate comprises a second outer circuit layer, a metal layer is disposed on a surface of the heat conducting block facing the first outer circuit substrate and a surface facing the second outer circuit substrate, the metal layer is connected to the first outer circuit layer and the second outer circuit layer.

4. The circuit board assembly of claim 1, wherein the circuit board assembly further comprises a connecting block, the second outer circuit substrate comprises a second outer dielectric layer and a second outer circuit layer stacked with each other, and the connecting block connects the heat conducting block and the second outer circuit layer.

5. A method for manufacturing a circuit board assembly, the method comprising providing an inner circuit substrate with a through hole; placing a heat conducting block in the through hole, and the heat conducting block made of aluminum nitride; forming a first outer circuit substrate and a second outer circuit substrate on opposite surfaces of the inner circuit substrate, the first outer circuit substrate and the second outer circuit substrate covering the heat conducting block; forming an accommodating groove penetrating through the first outer circuit substrate and recessed toward the heat conducting block; at least partially accommodating a lens module in the accommodating groove comprising: accommodating a chip of the lens module in the accommodating groove such that an electrical connection portion of the chip is exposed, and electrically connecting the chip to the first outer circuit substrate; and connecting a lens of the lens module to a surface of the first outer circuit substrate, and electrically connecting the lens to the chip, the chip and the lens cooperatively forming a hollow cavity; and forming a reinforcing plate on a surface of the second outer layer circuit substrate corresponding to the lens module and facing away from the lens module.

6. The method of claim 5, wherein the first outer circuit substrate comprises a first outer dielectric layer the second outer circuit substrate comprises a second outer dielectric layer; both the first outer dielectric layer and the second outer dielectric layer are connected to the heat conducting block.

7. The method of claim 5, wherein before accommodating the chip in the accommodating groove, the method further comprises:

filling a heat conducting filler in the accommodating groove, causing the chip to be spaced apart from the heat conducting block.

8. The method of claim 5, wherein the second outer circuit substrate comprises a second outer dielectric layer and a second outer circuit layer stacked with each other, forming the second outer circuit substrate further comprises forming a connecting block connecting the heat conducting block and the second outer circuit layer.

9. The method of claim 5, wherein forming the reinforcing plate is after forming the second outer circuit substrate.

10. The method of claim 5, wherein a metal layer is disposed on a surface of the heat conducting block, the first outer circuit substrate comprises a first outer circuit layer, and the second outer circuit substrate comprises a second outer circuit layer, the first outer circuit layer and the second outer circuit layer are directly connected to the metal layer.

* * * * *